United States Patent [19]

Hartman et al.

[11] Patent Number: 4,602,268

[45] Date of Patent: Jul. 22, 1986

[54] HIGH VOLTAGE DIELECTRICALLY ISOLATED DUAL GATE SOLID-STATE SWITCH

[75] Inventors: Adrian R. Hartman, New Providence; Alfred U. MacRae, Berkeley Heights, both of N.J.; Peter W. Shackle, West Melbourne, Fla.

[73] Assignee: AT&T Bell Laboratories, Murray Hill, N.J.

[21] Appl. No.: 333,762

[22] Filed: Dec. 23, 1981

Related U.S. Application Data

[63] Continuation-in-part of Ser. No. 248,305, Mar. 27, 1981, abandoned, which is a continuation-in-part of Ser. No. 107,772, Dec. 28, 1979, abandoned, which is a continuation-in-part of Ser. No. 972,021, Dec. 28, 1978, abandoned.

[51] Int. Cl.$^4$ .............................................. H01L 29/74
[52] U.S. Cl. ..................................... 357/38; 357/21;
357/22; 357/23.13; 357/39; 357/41; 357/49
[58] Field of Search ...................... 357/21, 22, 23, 38,
357/39, 41, 49

[56] References Cited

U.S. PATENT DOCUMENTS

| 3,417,393 | 12/1968 | Cooke | 357/21 |
|---|---|---|---|
| 3,657,616 | 4/1972 | Mizushima | 357/21 |
| 3,722,079 | 3/1973 | Beasom | 357/21 |
| 3,755,012 | 8/1973 | George et al. | 357/22 |
| 3,911,463 | 10/1975 | Hull | 357/21 |
| 4,060,821 | 11/1977 | Houston et al. | 357/22 |
| 4,074,293 | 2/1978 | Kravitz | 357/34 |
| 4,146,905 | 3/1979 | Appels | 357/44 |

FOREIGN PATENT DOCUMENTS

| 2102103 | 7/1971 | Fed. Rep. of Germany | 357/22 |
|---|---|---|---|
| 2433981 | 2/1975 | Fed. Rep. of Germany | 357/38 |
| 1547287 | 12/1967 | France | 357/38 |

OTHER PUBLICATIONS

A MOS-Controlled Triac Device—Scharf et al—pp. 222–223, 1978, IEEE International Solid State Circuits Conf.
IEEE Transactions on Electron Devices, vol. ED-23, No. 8, Aug. 1976, pp. 905-911—"A Field Terminated Diode".
Japanese Journal of Applied Physics, vol. 7, No. 12, Dec. 1968, pp. 1484-1490, "Threshold Current Density and Power Saturation in Read Diode".
IBM Technical Disc. Bul., vol. 8, No. 11, Apr. 1966, pp. 1688-1689, "Encapsulation for Semiconductor Devices".

*Primary Examiner*—Edward J. Wojciechowicz
*Attorney, Agent, or Firm*—David I. Caplan

[57] ABSTRACT

A high voltage solid-state switch, which provides bidirectional blocking, consists of a first p— type semiconductor body having a major surface and being separated from a support member (semiconductor substrate) by a dielectric layer with a p+ type anode region located at one end of the semiconductor body and having a portion which is common with the major surface, an n+ type cathode region located at the other end and having a portion which is common with the major surface, and an n+ type gate region having a portion which is common with the major surface and in one embodiment being located essentially between the anode and cathode regions and in another embodiment being located other than directly between the anode and cathode regions. A second p type region of higher impurity concentration than the semiconductor body surrounds the cathode region. An n+ type semiconductor layer is sandwiched between the semiconductor body and the dielectric layer. Separate low resistance electrical contacts are made to the anode, cathode, and gate regions and to the substrate. The switch is capable of switching from an "ON" and conducting state to an "OFF" (blocking) state by adjusting the potential of the gate region and without having to adjust the potential of the anode or cathode regions.

6 Claims, 4 Drawing Figures

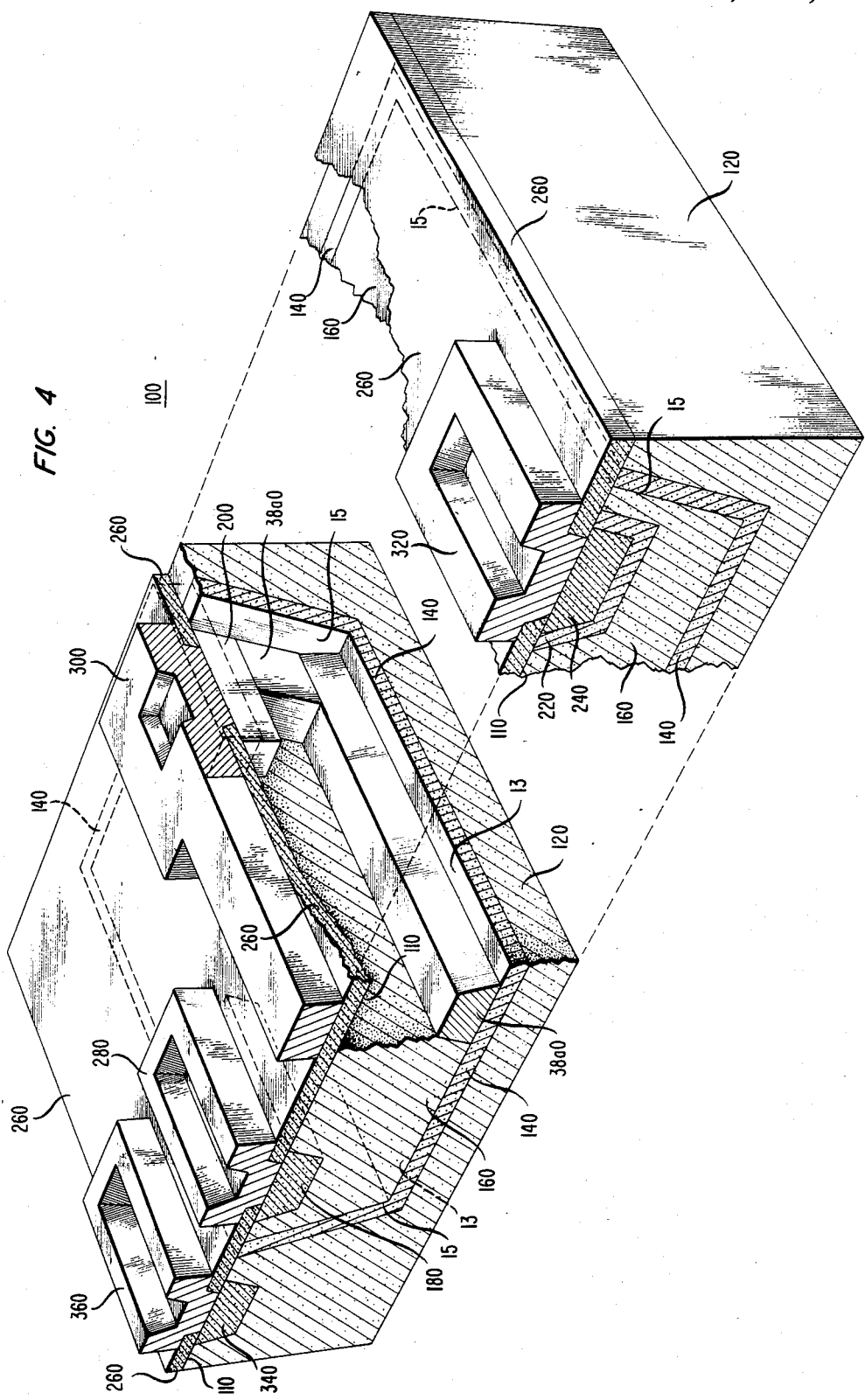

HIGH VOLTAGE DIELECTRICALLY ISOLATED DUAL GATE SOLID-STATE SWITCH

CROSS-REFERENCE TO RELATED APPLICATIONS

This application is a continuation-in-part of our co-pending application Ser. No. 248,305, filed Mar. 27, 1981, and now abandoned, which is a continuation-in-part of our application Ser. No. 107,772, filed Dec. 28, 1979 and now abandoned, which is a continuation-in-part of our application Ser. No. 972,021, filed Dec. 28, 1978 and now abandoned.

TECHNICAL FIELD

This invention relates to solid-state structures and, in particular, to high voltage solid-state structures useful in telephone switching systems and many other applications.

BACKGROUND OF THE INVENTION

German Pat. No. 2,102,103 discloses a field-effect diode structure having a p− type substrate with an n− type epitaxial layer grown on top of the substrate. The substrate can be replaced by an insulating material. A first p+ type anode region, a second p+ type gate region, and an n+ type cathode region exist within portions of the epitaxial layer and each forms a portion of a common surface of the epitaxial layer. The three regions are separated from each other by portions of the epitaxial layer. The patent states that conduction between anode and cathode can only be interrupted by setting the anode voltage to a zero or negative level for a short period of time and by setting the gate voltage to a predetermined critical level. It is undesirable and/or impractical in many applications to have to adjust the anode voltage. Leakage of the diode is stated to cause it to switch on when it should be off. It is unclear how the suggested solution of a register helps solve this problem and whether or not such a register is a discrete component or can be integrated on the same substrate as the diode. It is also unclear how to physically and electrically isolate the diode from other components on the common substrate.

In an article entitled "A Field Terminated Diode" by Douglas E. Houston et al, published in *IEEE Transactions on Electron Devices*, Vol. ED-23, No. 8, August 1976, and in U.S. Pat. No. 4,060,821 (Douglas E. Houston et al), issued Nov. 29, 1977, there is described a discrete solid-state high voltage switch that has a vertical geometry and which includes a region that can be pinched off to provide an "OFF" state or which can be made highly conductive with dual carrier injection to provide an "ON" state. One problem with this switch is that it is not easily manufacturable with other like switching devices on a common substrate. Another problem is that the spacing between the grids and the cathode should be small to limit the magnitude of the control grid voltage; however, this limits the useful voltage range because it decreases grid-to-cathode breakdown voltage. This limitation effectively limits the use of two of the devices with the cathode of each coupled to the anode of the other to relatively low voltages. Such a dual device structure would be useful as a high voltage bidirectional solid-state switch. An additional problem is that the base region should ideally be highly doped to avoid punch-through from the anode to the grid; however, this leads to a low voltage breakdown between anode and cathode. Widening of the base region limits the punch-through effect; however, it also increases the resistance of the device in the "ON" state.

It is desirable to have a solid-state switch which is easily integratable such that two or more switches can be simultaneously fabricated on a common substrate and wherein each switch is adapted such that one terminal thereof controls its state and each switch is capable of bilateral blocking of relatively high voltages and breaking current. One such structure is described in copending U.S. patent application Ser. Nos. 972,056 and 107,774, filed Dec. 20, 1978 and Dec. 28, 1979, respectively, and in copending U.S. patent application Ser. No. 248,192, filed Mar. 27, 1981. All of these applications have a common assignee. This present application relates to a subsequent improvement in such structures.

SUMMARY OF THE INVENTION

One embodiment of the present invention is a structure comprising a semiconductor body whose bulk is of one conductivity type and which has a major surface. Within the semiconductor body is a localized first region which is of the one conductivity type, and localized second and third regions which are both of the opposite conductivity type. The first, second, and third regions are spaced apart from each other, have separate electrode connections thereto, and are of relatively low resistivity as compared to the bulk of the semiconductor body. Each of the three regions has a portion which forms part of the major surface of the semiconductor body. A semiconductor layer of the same conductivity type as the second region contacts the bulk portion of the semiconductor body and is at least partly separated from the second region by portions of the bulk of the semiconductor body. The structure is adapted such that selectively during operation there is dual carrier injection. The structure is also adapted to selectively facilitate substantial current flow between the first and third regions or to divert a sufficient flow of said current into the second region so as to interrupt (cut off) said current flow between the first and third regions. It is further adapted to selectively inhibit substantial current flow between the first and third regions. The overall geometry and impurity concentrations of the structure have been selected so as to aid in the inhibiting or interrupting of current flow between the first and third regions.

In a preferred embodiment, the semiconductor body is separated from a semiconductor support member (typically a substrate) by a dielectric layer and the support is adapted to facilitate an electrode being coupled thereto. Sandwiched between the dielectric layer and the semiconductor body is a semiconductor layer of the opposite conductivity type of the semiconductor body. This semiconductor layer can be designed to partly or completely separate the dielectric layer from the semiconductor body. In this preferred embodiment the semiconductor body is of p− type conductivity and first, second, and third regions serve as the anode, gate, and cathode, respectively, of the structure. The semiconductor layer that forms part of the gate is in contact with the second region which is located in a portion of the semiconductor body that is not directly between the anode and cathode.

The structure of the present invention, when suitably designed, can be operated as a switch that is characterized by a low impedance path between anode and cathode when in the ON state and a high impedance path between anode and cathode when in the OFF (blocking) state. The potential applied to the gate region determines the state of the switch. In a preferred embodiment of semiconductor layer is a partial layer and the semiconductor support member is biased at the most positive potential used with the structure when the semiconductor body is of p− type conductivity and at the most negative potential when it is of n− type conductivity. The biased semiconductor support member serves to aid in establishing the OFF state. There is no need to adjust the potentials to the anode or the cathode to cause the switch to assume the OFF state. The switch inhibits or interrupts (cuts off) conduction between the anode and cathode when it is set to the OFF state. During the ON state, with appropriate potentials applied to the anode and cathode, there is dual carrier injection that results in the resistance between anode and cathode being relatively low.

This structure, which is to be denoted as a gated diode switch (GDS), when suitably designed, is capable in the OFF state of blocking relatively large potential differences between anode and cathode regions, independent of polarity, and is capable in the ON state of conducting relatively large amounts of current with a relatively low voltage drop between anode and cathode. A complete semiconductor layer sandwiched between the dielectric layer and semiconductor body acts to isolate the semiconductor body from the properties of the dielectric layer substantially from any electric field created by a potential applied to the substrate.

Arrays of these bodies can be fabricated on a single or common silicon substrate together with other high voltage circuit components. The bilateral blocking characteristic of the present structure facilitates its use as a bidirectional switch comprising two of the bodies with the anode of each coupled to the cathode of the other and the gates being coupled together.

These and other novel features and advantages of the present invention are better understood from consideration of the following detailed description taken in conjunction with the accompanying drawings.

BRIEF DESCRIPTION OF THE DRAWINGS

FIG. 4 illustrates a structure in accordance with still another embodiment of the invention.

DETAILED DESCRIPTION

Figure 1:
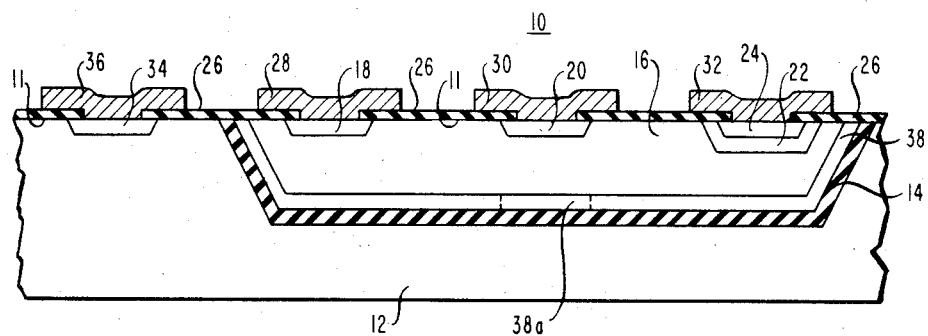
FIG. 1 illustrates a structure in accordance with one embodiment of the invention.

Referring now to FIG. 1, there is illustrated a structure 10 comprising a support member 12 having a major surface 11 and a semiconductor body 16 whose bulk is of one conductivity type and which is separated from support member 12 by an insulator layer 14 which is typically a dielectric layer. The semiconductor body has a portion that is common with surface 11. Sandwiched between semiconductor body 16 and dielectric layer 14 is a semiconductor region (layer) 38 which is of the opposite conductivity type of semiconductor body 16. Alternately, a portion of layer 38, illustrated by dashed lines and denoted as layer 38a, can be used instead of the entire layer 38.

A localized first anode region 18, which is of the one type conductivity, is included in body 16 and has a portion thereof that extends to surface 11. A localized second gate region 20, which is of the opposite conductivity, also is included in body 16 and has a portion thereof which extends to surface 11. A localized third cathode region 24, which is of the opposite type conductivity of body 16, also is included in body 16 and has a portion which extends to surface 11. A region 22, which is of one type conductivity and has a portion which extends to surface 11, surrounds region 24 and acts as a depletion layer punch-through shield and to inhibit inversion of the portions of body 16 close thereto. It also acts to increase the voltage blocking capability between gate region 20 and cathode region 24. Region 22 separates cathode region 24 from the bulk portion of semiconductor body 16. Layer 38 (38a) is of the same conductivity type as gate region 20. Gate region 20 exists between anode region 18 and region 22 and is separated from both by bulk portions of body 16. The resistivities of regions 18, 20, and 24 and of layer 38 (38a) are low compared to that of the bulk portions of body 16. The resistivity of region 22 is intermediate between that of region 24 and that of the bulk portions of body 16.

Electrodes 28, 30, and 32 are conductors which make low resistance contact to the surface portions of regions 18, 20, and 24, respectively. A dielectric layer 26 covers major surface 11 so as to isolate electrodes 28, 30, and 32 from all regions other than those intended to be electrically contacted. Electrode 30 typically makes actual contact to layer 38 (38a) at surface 11 in the rear or front of body 16. In some cases this is not necessary since the portion of the bulk of body 16 between the surface portions of electrode 30 and layer 38 (38a) is inverted so as to electrically connect the two.

Layer 38a can be modified such that it exists only on the lower portion of body 16. With such modifications an appropriate diffused or ion implanted region(s) (not illustrated) can be formed between surface 11 and modified layer 38a. Electrode 30 typically makes actual electrical contact to these added regions (not illustrated) at surface 11. Electrode 30 does not necessarily have to make direct contact to these regions. In some cases the portion of the bulk of semiconductor body 16 between the surface portions of these regions and electrode 30 is inverted so as to electrically connect the two. Even if such an inverted region is not formed, region 38a still serves to reduce the magnitude of the potential applied to gate electrode 30 since the bulk portion of body 16 between gate region 20 and layer 38a is reduced in thickness from what exists if layer 38a is not present.

Advantageously, the support member 12 can be of silicon either of n or p type conductivity. If it is of n type conductivity then a contact region 34 of n+ type conductivity is formed in substrate 12. If of p type conductivity then a contact region 34 of p+ type conductivity is formed in substrate 12. An electrode 36 makes low resistance contact to region 34. Each of electrodes 28, 30 and 32 advantageously overlaps the semiconductor region to which they make low resistance contact. Electrode 32 also overlaps region 22. This overlapping, which is known as field plating, facilitates high voltage operation because it increases the voltage at which breakdown occurs.

In one illustrative embodiment, substrate 12, body 16, and regions 18, 20, 22, 24, and 34 and layer 38 (38a) are of n−, p−, p+, n+, p, n+, n+ and n+ type conductivity, respectively. Dielectric layer 14 is silicon dioxide and electrodes 28, 30, 32, and 36 are all aluminum.

A plurality of separate bodies 16 can be formed in common support member 12 to provide a plurality of switches.

Structure 10 is typically operated as a switch which is characterized by a low impedance path between anode region 18 and cathode region 24 when in the ON state and as a high impedance between said two regions when in the OFF (blocking) state. The type of structure described herein is denoted as a gated diode switch (GDS). Substrate 12 is typically held at the most positive potential level available when body 16 is of p− type conductivity. It is held at the most negative potential level available when body 16 is of n− type conductivity. With operating potentials applied to the regions 18 and 24, the potential applied to gate region 20 determines the state of the switch. Regions 18 and 24 serve as the anode and cathode regions, respectively, when semiconductor body 16 is of p− type conductivity. Regions 18 and 24 serve as the cathode and anode regions, respectively, when semiconductor body 16 is of n− type conductivity.

With body 16 being of p− type conductivity, conduction between anode region 18 and cathode region 24 is inhibited or interrupted (cut off) if the potential of gate region 20 is sufficiently more positive than that of anode region 18, cathode region 24, and region 22. The amount of excess positive potential needed to inhibit or interrupt (cut off) conduction is a function of the geometry and impurity concentration (doping) levels of structure 10. This positive gate potential causes a vertical cross-sectional portion of body 16 between gate region 20 and the portion of layer 38 (38a) there below to be depleted and the potential of this portion of body 16 to be greater in magnitude than that of anode region 18, cathode region 24, and region 22. This positive potential barrier inhibits the conduction of holes from anode region 18 to cathode region 24. It essentially pinches off body 16 in the bulk portion thereof below gate region 20 and extending down to layer 38 (38a). If conduction exists between anode region 18 and cathode region 24 before the potential of the gate region 20 is raised to the high potential level, then gate region 20 serves to collect electrons emitted at cathode region 24 before they can reach anode region 18. This serves to help interrupt conduction between anode region 18 and cathode region 22. In addition, the high level potential of gate region 20 serves to cause a vertical cross-sectional portion of body 16 between gate region 20 and the portion of layer 38 (38a) there below to be depleted and the potential of this portion of body 16 to be greater in magnitude than that of anode region 18, cathode region 24, and region 22. The blocking (essentially non-conducting) state, is the OFF state. The geometry and impurity concentrations of structure 10 are designed to help inhibition interrupt current flow between anode region 18 and cathode region 24.

Layer 38, when coupled to region 20 via a low resistance path, serves essentially to minimize the electric field created by the potential applied to substrate 12 from influencing semiconductor body 16.

With layer 38a used, the voltage applied to semiconductor support 12 causes an electric field which extends through dielectric layer 14 and into a portion of semiconductor layer 38a and into the portion of the bulk of semiconductor 16 which is in contact with dielectric layer 14. Normally, during the ON state, electrons coat the bottom of layer 38a and the portion of the bulk of semiconductor body 16 which is in contact with dielectric layer 14 and act to shield semiconductor body 16 from the effect of the positive bias applied to substrate 12. With structure 10 biased to the OFF state, these electrons are removed from the bottom of semiconductor body 16 and are drawn into gate region 20 and then into gate electrode 30. This field tends to cause depletion of semiconductor body 16 and also helps cause the potential of the portion of the bulk portion of body 16 between gate region 20 and extending down to dielectric layer 14 to be greater in magnitude than that of anode region 18. The positive potential applied to layer 38a serves to deplete the portion of the bulk of body 16 between the gate region 20 and down to layer 38a and to cause the potential of this portion of body 16 to be greater in magnitude than that of anode region 18. The biased substrate 12 and layer 38a and/or layer 38 thus act as second or back gates which aid in switching structure 10 to the OFF state. Control circuitry capable of supplying the needed gate potentials and absorbing the electrons is illustrated and described in U.S. patent application Ser. No. 248,206, filed Mar. 27, 1981 and having two common inventors and a common assignee with the present application.

With semiconductor body 16 being of p− type conductivity, conduction from anode region 18 to cathode region 24 occurs if anode region 18 is forward-biased with respect to cathode region 24 and the potential of gate region 20 is below a level which inhibits or interrupts conduction between anode region 18 and cathode region 24. During the ON state holes are injected into body 16 from anode region 18 and electrons are injected into body 16 from cathode region 24. These holes and electrons can be in sufficient numbers to form a plasma which conductivity modulates body 16. This effectively lowers the resistance of body 16 such that the resistance between anode region 18 and cathode region 24 is relatively low when structure 10 is operating in the ON state. This type of operation is denoted as dual carrier injection.

Region 22 helps limit the punch-through of a depletion layer formed during operation between gate region 20 and cathode region 24 and helps inhibit formation of a surface inversion layer between these two regions. In addition, it facilitates gate region 20 and cathode region 24 being relatively closely spaced apart. This facilitates relatively low resistance between anode region 18 and cathode region 24 during the ON state. It also serves to increase maximum operating voltage and to reduce leakage currents.

During the ON state of structure 10, the junction diode comprising semiconductor body 16 and gate region 20 can become forward-biased. Current limiting means (not illustrated) are normally included to limit the conduction through the forward-biased diode. One example of such current limiting means is illustrated and described in U.S. patent application Ser. No. 248,206.

The ON state can be achieved by having the potential of the anode region 18 greater than that of the cathode region 24 and forward-biasing the anode region 18 with respect to the gate region 20. Typically, 1–10 microamperes are pulled out of the gate region 20 while the anode-gate junction is forward-biased to cause structure 10 to assume the ON state.

It is possible to operate structure 10 on the ON state with the potential of gate region 20 at the same or a more positive level than that of anode region 18, cathode region 24, and region 22, so long as the potential of gate region 20 is below a level which essentially completely depletes a vertical cross-sectional portion of semiconductor body 16 between anode region 18 and cathode region 24. With the gate region 20 held at such a potential level, the junction diode comprising semiconductor body 16 and gate region 20 has a zero forward bias or is reverse-biased.

Layer 38 serves to isolate body 16 from the properties of dielectric layer 14 and the electric field created by the potential applied to substrate 12 and is thus believed to aid the fabrication process in that the tolerances in the formation of the dielectric layer 14 can be relaxed somewhat. This is believed to help increase fabrication yields and thus reduce costs. In addition layer 38 serves as a lower gate region which aids in reducing the magnitude of the gate potential needed to inhibit or interrupt (cut off) conduction between anode region 18 and cathode region 24. The use of only portion 38a of layer 38 serves to isolate semiconductor body 16 from region 14 in the portion of semiconductor body 16 which is under gate region 20. This particular portion of semiconductor body 16 is the most critical portion since semiconductor body 16 is essentially "pinched off" in this portion when structure 10 is operated in the OFF state.

Layer 38a does not provide complete isolation from dielectric layer 14 but is believed to be the preferred embodiment because it provides an improvement in the magnitude of the gate potential while essentially not effecting the breakdown voltage of the structure. Layer 38 provides complete isolation from dielectric layer 14 but does reduce the breakdown voltage of the structure somewhat. If layer 38 is used, then generally body 16 and/or dielectric layer 14 are increased in thickness in order to maintain breakdown voltages at preselected levels. Layers 38 and 38a act to reduce the resistance between anode region 18 and cathode region 24 since electrons can flow through these regions and these regions are of lower resistivity than the bulk portion of body 16.

Figure 2:
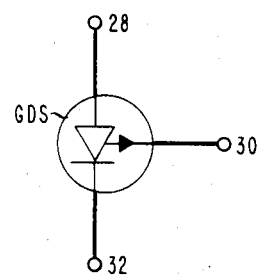
FIG. 2 illustrates a proposed electrical symbol for the structure of FIG. 1.

FIG. 2 illustrates an adapted symbol for this type of switch. The anode, gate, and cathode electrodes are denoted as terminals 28, 30, and 32, respectively.

It has been discovered that decreasing the impurity concentration of the bulk portion of semiconductor body 16 of structure 10 of FIG. 1 causes a modification in the mode of operation. Starting with the above design parameters, but with the impurity concentration of the bulk of semiconductor body 16 at approximately $1 \times 10^{13}$ instead of $9 \times 10^{13}$ impurities/cm$^3$, it was found that with the potential of gate region 20 at approximately the same level as anode region 18, conduction between anode region 18 and cathode region 24 is inhibited or interrupted (cut off) except for a relatively low level flow. This is the OFF (high impedance) state. With a positive bias applied to anode region 18 relative to cathode region 24, and with gate region 20 allowed to essentially electrically float in potential, substantial current flow can exist between anode region 18 and cathode region 24. The relatively low level current flow of the OFF state helps aid in switching structure 10 to the ON state. This is the ON (low impedance) state. Control circuitry useful to control the state of a structure 10 which has the operating characteristics described in this paragraph is described in U.S. patent application Ser. No. 248,206, filed Mar. 27, 1981, and which is a continuation-in-part of U.S. patent application Ser. No. 107,771, filed Dec. 28, 1979 and now abandoned. Ser. No. 107,771 is in itself a continuation-in-part of U.S. patent application Ser. No. 972,023, abandoned June 24, 1980.

One major advantage of structure 10, which has a semiconductor body 16 whose impurity concentration is as described immediately hereinabove, is that the magnitude of the gate potential need only be at that of the anode potential to switch the structure to the OFF state. It is thus not necessary to use a higher potential than exists at the anode in order to operate structure 10. Many applications require high voltage and high current switches but the most positive potential available is that applied to one of the terminals of the switch. This embodiment of structure 10 can be used in such applications so long as a limited amount of current flow can be tolerated between the anode and cathode regions when structure 10 is in the OFF state. It is, however, necessary to maintain fairly tight tolerances on the impurity concentration of semiconductor body 16 in order to operate structure 10 as indicated.

Figure 3:
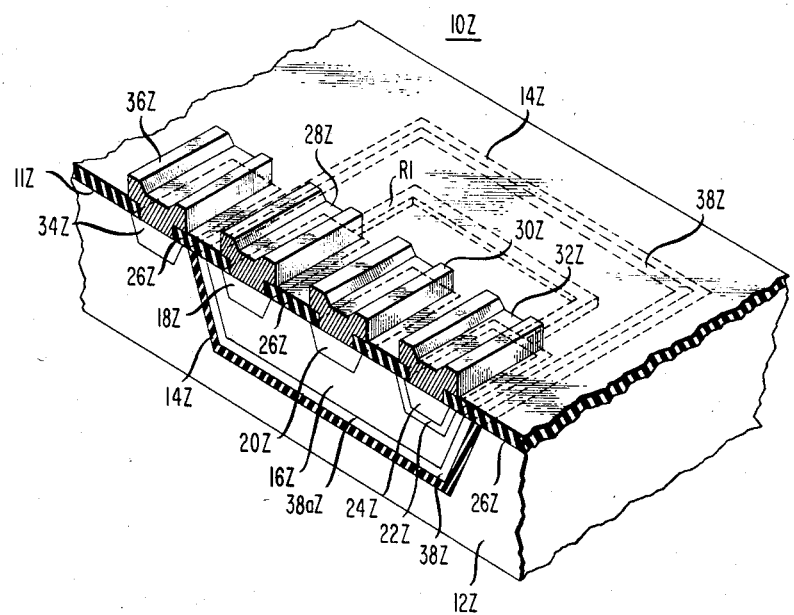
FIG. 3 illustrates a structure in accordance with another embodiment of the invention.

Referring now to FIG. 3, there is illustrated a structure 10z which is very similar to structure 10 of FIG. 1 and all components thereof which are essentially identical or similar to structure 10 are denoted with the same reference number with the addition of the letter "z". The basic difference between structures 10z and 10 is the existence of a resistive-type region R1 in structure 10z which couples anode region 18z to shield region 22z. The inclusion of region R1 allows structure 10z to be operated with the maximum needed gate potential being approximately equal to the anode potential and allows for a considerably wider variation in the impurity concentration of semiconductor body 16z than is possible if R1 is not utilized. R1 serves to provide a predictable high impedance path between anode region 18z and shield region 22z. Variations in the impurity concentration of semiconductor body 16z thus become less critical since a high impedance path is established between anode region 18z and shield region 22z and this path exists relatively independent of the impurity concentration of semiconductor body 16z. Typically, the impurity concentration of semiconductor body 16z is between $2 \times 10^{12}$ impurities/cm$^3$ and $2 \times 10^{13}$ impurities/cm$^3$. R1 can be ion implanted or diffused into semiconductor body 16z. A discrete resistor could be connected between anode electrode 28z and region 22z, provided an electrode (not illustrated) is provided which is in contact with region 22a. This resistor would serve essentially the same purpose as R1. In a preferred embodiment, R1 is an ion implanted pinch type resistor and is of the same conductivity type as regions 18z and 22z. Region 22z can be eliminated in some applications. In this case R1 is extended so as to contact cathode region 24z or a discrete R1 could instead be connected to anode electrode 36z and to a p+ type contact region (not illustrated) within body 16 and located close to cathode region 24z.

Referring now to FIG. 4, there is illustrated a structure 100 which is similar in basic operation and structure to structure 10 of FIG. 1. The components of structure 100 which are essentially identical or similar to those of structure 10 of FIG. 1 are denoted with the same reference number with the addition of a "0". One basic difference between the two structures is that remote gate region 200 of FIG. 4 does not extend directly between anode region 180 and cathode region 240 whereas gate region 20 of FIG. 1 does extend directly between anode region 18 and cathode region 24. Region 28a0 and 200 are both of the same type conductivity and together with electrode 300 comprise the gate of structure 100. The portion of region 38a0 which extends up one of side walls 15 (the rear side wall) of semiconductor body 160 is optional. The horizontal portion of region 38a0 is on top of a bottom surface 13 of semiconductor body 160.

Remote gate region 200 is located in a portion of surface 110 of the bulk portion of semiconductor body 160 other than those portions which are directly between anode region 180 and cathode region 240. This allows regions 180 and 240 to be closer together than is reasonably possible if there is a gate region which is located between anode region 180 and cathode region 240 and extends from surface 110 downward into semiconductor body 160. Electrode 300 does extend between anode electrode 280 and cathode electrode 320 but is separated from the portion of the surface 110 which exists directly between anode region 180 and cathode region 240 by dielectric layer 260. For given maximum operating potentials, the ON resistance of structure 100 can be lower than the ON resistance of structure 10 of FIG. 1 because anode region 180 and cathode region 240 can be closer together than anode region 18 and cathode region 24. A gated diode switch structure having a remote gate region, like region 200, is described in copending U.S. patent application Ser. No. 248,281, filed Mar. 27, 1981 and having two common inventors and a common assignee with the present invention.

Structure 100 has relatively low ON resistance yet also has relatively good current break (interrupt) capability as region (semiconductor layer) 38a0 is located in essentially a centralized position below anode region 180 and cathode region 240 and as such can selectively collect a substantial amount of electrons emitted from cathode region 240. Electrode 300, in addition to serving as an electrical connection to regions 200 and 38a0, serves as an MOS gate. A positive potential applied to electrode 300 sets up a potential barrier which extends from surface 110 downward and from layer 38a0 upward and outward from the rear side wall(s) of semiconductor body 160. The net affect is to selectively cause a vertical cross section of semiconductor body 160 between anode region 180 and cathode region 240 to be at a higher potential than anode region 180, cathode region 240, and/or shield region 220, and to essentially completely deplete this portion of the bulk of semiconductor body 160.

Electrode 300 and region 38a0 can both extend across to the front side wall (not illustrated) of semiconductor body 160 and make electrical contact there. A second remote gate region, like region 200, can be located at or near the front side wall of semiconductor body 160 and electrode 300 and/or region 38a0 can contact same. This could enhance current break capability and/or reduce the magnitude of the potential needed to produce current break.

Region 38a0 need not always extend up one of side walls 15 of semiconductor body 160. In some cases portions near the rear and/or of front side wall 15 of the bulk portion of semiconductor body 160 would be inverted so that there is effective electrical contact between region 200 and modified region 38a0.

Decreasing the impurity concentration of the semiconductor body 160 from approximately $9 \times 10^{13}$ impurities/cm$^3$ to approximately $1 \times 10^{13}$ impurities/cm$^3$ causes a similar change in operation of structure 100 as the corresponding change caused in the operation of structure 10 of FIG. 1.

The embodiments described herein are intended to be illustrative of the general principles of the invention. Various modifications are possible consistent with the spirit of the invention. For example, for the designs described, support member 12 can be p— type conductivity silicon, gallium arsenide, sapphire, or an electrically inactive material. If support member 12 is an electrically inactive material, then dielectric layer 14 can be eliminated. Still further, body 16 can be fabricated as an air-isolated structure. This allows for the elimination of support member 12 and dielectric layer 14. Further, the electrodes can be doped polysilicon, gold, titanium, or other types of conductors. Still further, the impurity concentration levels, spacings between different regions, and other dimensions of the regions can be adjusted to allow significantly higher operating voltages and currents than are described. Additionally, other types of insulator (dielectric) materials, such as silicon nitride or Semi-Insulating Polycrystalline Oxygen Doped Silicon (SIPOS) can be substituted for silicon dioxide. Still further, the conductivity type of all regions can be reversed provided the voltage polarities are appropriately changed in the manner well known in the art. Two structures of the present invention with common gate terminals and the anode of each coupled to the cathode of the other allow for alternating or direct current operation. Still further, the semiconductor region 22, which surrounds the cathode, can be modified to also include a guard ring region as is illustrated in copending U.S. patent application Ser. No. 248,192. Still further, layer 38 (38a, 38z, 38az, and 38a0) can be of n— or n type conductivity. Still further, a single semiconductor substrate can contain some semiconductor bodies which are of p— type conductivity and others which are of n— type conductivity. Still further, additional semiconductor regions of the same conductivity type as anode region 180, but of increasing resistivity can be formed around region 180 and additional semiconductor regions of the same conductivity type as region 220 can be formed around region 220. Added regions of this type are illustrated in copending U.S. patent application Ser. No. 248,192 and serve to extend operating voltage ranges. Still further, region 220 may be extended, preferably towards the rear of semiconductor body 160, so as to allow a contact region and an electrode to be connected thereto so as to allow structure 100 to use an integral junction transistor comprising regions 38a0 and 200 as the collector, semiconductor body 160 and region 220 as the base, and cathode region 240 as the emitter. Such a structure is illustrated in copending U.S. patent application Ser. No. 107,776, filed Dec. 28, 1978 and in which there is one common inventor and a common assignee with the present application. Still further, the addition of a resistive-type region, like region R1 in structure 10z of FIG. 3, between the anode region 180 and the shield region 220 of structure 200 of FIG. 4 allows said structure to operate like and have essentially the same allowed variation of impurity concentration of the semiconductor body 160 as structure 10z of FIG. 3. Still further, gate region (semiconductor layer) 38a0 may be located above the major bottom surface. Still further, region 200 need not extend to the rear or front side wall 15 of semiconductor body 160. Still further, the portion of gate region 38a0 which extends up the rear side wall 15 of semiconductor body 160 could extend all the way up to surface 110 and be separated from region 200 by portions of the bulk of semiconductor body 160 and be electrically connected to gate region 200 by electrode 300. Still further, region 38a0 may extend upward and make contact with region 200 and/or extend to surface 110 while not contacting any of the side walls 15 of semiconductor body 160.

What is claimed is:

1. A switching element comprising a semiconductor body having a bulk region of one conductivity type and of relatively high resistivity; the body also having anode, gate, and cathode regions spaced apart and localized along a common top planar surface of the body, each being of relatively low resistivity, the cathode and gate regions being of the opposite conductivity type from that of the bulk region and the anode region being of the same conductivity type as that of the bulk region; separate cathode, anode, and gate electrodes attached to the cathode, anode, and gate regions, respectively; the a semiconductor support member separated from the semiconductor body by a dielectric layer; a semiconductor layer of the same conductivity type as the cathode region, the semiconductor layer being electrically coupled to the gate region and being sandwiched between the dielectric layer and the semiconductor body; the parameters of the switching element being such that with the potential of the anode region being greater than that of the cathode region and the potential of the gate region being insufficient to essentially completely deplete a cross-sectional portion of the bulk region of the semiconductor body between the anode and cathode regions, a substantial current flows between the anode and cathode regions via the bulk region, and with the anode region being forward-biased with respect to the cathode region and with the potential of the gate region being of sufficiently greater magnitude than that of the anode region so as to essentially completely deplete a cross-sectional portion of the bulk region of the semiconductor body located between the anode and cathode regions and to cause this portion of the bulk region of the semiconductor body to be at a potential which is greater in magnitude than the anode region, an interrupting of the current between the anode and cathode regions occurs.

2. A switching element in according with claim 1 in which the gate region is localized on the common surface intermediate between the cathode and anode regions.

3. A switching element in accordance with claim 1 further comprising a semiconductor shield region within the semiconductor body and being of the same conductivity type as the bulk but of lower resistivity, the shield region surrounding the cathode region so as to separate the cathode region from the bulk region of the semiconductor body.

4. A plurality of switching elements in accordance with claim 1 with each included in the semiconductor support member and dielectrically isolated from one another.

5. A pair of switching elements each in accordance with claim 1 with the gate electrodes of the pair connected to each other and the anode electrode of each connected to the cathode electrode of the other to provide a bilateral switch.

6. A switching element comprising a semiconductor body having a hulk region of one conductivity type and of relatively high resistivity; the body also having anode gate, and cathode regions spaced apart and localized along a common planar surface of the body, each being of relatively low resistivity, the cathode and gate regions being of the opposite conductivity type from that of the bulk region, and the anode region being of the same conductivity type as the bulk, region; and a separate cathode, anode, and gate electrode connected to the cathode anode, and gate region, respectively; a semiconductor support member separated from a semiconductor layer by a dielectric layer; the semiconductor layer of the same conductivity type as that of the gate region, the semiconductor layer being sandwiched between the dielectric layer and the semiconductor body; the semiconductor support member having a separate electrode coupled thereto which is adapted to be held at the most positive potential used with the switching element if the gate region is of n+ type conductivity, and at the most negative potential used with the switching element if the gate region is of p+ type conductivity, the parameters of the various portions of the structure being such that with the potential of the anode region being forward-biased with respect to the cathode region and the potential of the gate region being insufficient to deplete a cross-sectional portion of the bulk of the semiconductor body between the anode and cathode regions and to cause this portion of thhe bulk of the semiconductor body to be at a potential which is greater in magnitude than that of the anode region, there is facilitated a substantial current flow between the anode and cathode regions via the bulk, and with the potential of the anode region being forward-biased with respect to the cathode region and with the potential of the gate region being of a sufficient magnitude relative to the anode region to deplete the portion of the bulk of the semiconductor body between the anode and cathode regions there is facilitated an inhibiting or interrupting (cutting off) of current flow between the anode and cathode regions.

* * * * *